United States Patent
Liu et al.

(10) Patent No.: US 11,066,600 B2
(45) Date of Patent: Jul. 20, 2021

(54) LUTETIUM NITRIDE-BASED PHOSPHOR AND LIGHT EMITTING DEVICE COMPRISING SAME

(71) Applicant: GRIREM ADVANCED MATERIALS CO., LTD., Beijing (CN)

(72) Inventors: Ronghui Liu, Beijing (CN); Weidong Zhuang, Beijing (CN); Fu Du, Beijing (CN); Yuanhong Liu, Beijing (CN); Wei Gao, Beijing (CN); Xia Zhang, Beijing (CN); Huibing Xu, Beijing (CN); Chunpei Yan, Beijing (CN); Xiaowei Zhang, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 102 days.

(21) Appl. No.: 16/313,894

(22) PCT Filed: Jun. 30, 2017

(86) PCT No.: PCT/CN2017/091241
§ 371 (c)(1),
(2) Date: Dec. 28, 2018

(87) PCT Pub. No.: WO2018/001370
PCT Pub. Date: Jan. 4, 2018

(65) Prior Publication Data
US 2019/0225882 A1    Jul. 25, 2019

(30) Foreign Application Priority Data
Jun. 30, 2016  (CN) .......................... 201610514087.3

(51) Int. Cl.
C09K 11/77    (2006.01)
C09K 11/08    (2006.01)
H01L 33/50    (2010.01)

(52) U.S. Cl.
CPC ...... *C09K 11/7766* (2013.01); *C09K 11/0883* (2013.01); *C09K 11/77* (2013.01); *H01L 33/502* (2013.01)

(58) Field of Classification Search
CPC ............ C09K 11/7766; C09K 11/0883; C09K 11/592; C09K 11/7734; H01L 33/502;
(Continued)

(56) References Cited

U.S. PATENT DOCUMENTS

2011/0235309 A1\* 9/2011 Miki ...................... H05B 33/14
                                                    362/97.2
2014/0291580 A1\* 10/2014 Zagumennyi ...... C09K 11/7774
                                                    252/301.4 F
(Continued)

FOREIGN PATENT DOCUMENTS

CN    101663372 A    3/2010
CN    102361956 A    2/2012
(Continued)

OTHER PUBLICATIONS

International Search Report for PCT/CN2017/091241 dated Aug. 23, 2017, ISA/CN.
(Continued)

*Primary Examiner* — Mouloucoulaye Inoussa
(74) *Attorney, Agent, or Firm* — Dragon Sun Law Firm, PC; Jinggao Li, Esq.

(57) ABSTRACT

A lutetium nitride-based phosphor and a light emitting device comprising the same, wherein the lutetium nitride-based phosphor comprises an inorganic compound, and the composition of the inorganic compound comprises at least an M element, an A element, a D element and an R element; the M element is one or two elements selected from a group consisting of Lu, La, Pr, Nd, Sm, Y, Tb and Gd, and necessarily comprises Lu; the A element is Si and/or Ge; the
(Continued)

D element is one or two elements selected from a group consisting of O, N and F, and necessarily comprises N; the R element is Ce and/or Dy, and the atomic molar ratio of the Lu element in the M element is greater than 50%. Because the ion radius of $Lu^{3+}$ is smaller than the ion radius of $La^{3+}$, the light color performance thereof can be flexibly adjusted according to needs.

17 Claims, 2 Drawing Sheets

(58) Field of Classification Search
 CPC ....... H01L 24/45; H01L 33/486; H05B 33/14; C04B 35/6262; C04B 35/597; Y02B 20/181

USPC ...... 257/91, 98, E33.061, E33.067; 106/440, 106/455
 See application file for complete search history.

(56) References Cited

U.S. PATENT DOCUMENTS

2017/0307807 A1* 10/2017 Van Bommel ....... G02B 6/0055
2018/0212112 A1* 7/2018 Nitta .................. H01L 33/0045

FOREIGN PATENT DOCUMENTS

| CN | 104962286 A | 10/2015 |
|---|---|---|
| CN | 105255495 A | 1/2016 |
| JP | 2012007096 A | 1/2012 |

OTHER PUBLICATIONS

Xin Xu, et al., "The Photoluminescence of Ce-doped $Lu_4Si_2O_7N_2$ Green Phosphors", Materials Chemistry and Physics, vol. 118, Dec. 31, 2009 (Dec. 31, 2009), ISSN: 0254-0584, pp. 270-272.
Seto, T. et al., "A New Yellow Phosphor $La_3Si_6N_{11}$: $Ce^{3+}$ for White LEDs", ECS Transactions, vol. 25, No. 9, Dec. 31, 2009 (Dec. 31, 2009), pp. 247-252.
Lihong Liu et al. "Yellow-Emitting $Y_3Si_6N_{11}$: $Ce^{3+}$ Phosphors for White Light-Emitting Diodes (LEDS)", J.Am. Cream. Soc., vol. 96, No. 6, Dec. 31, 2013 (Dec. 31, 2013), pp. 1688-1690.

* cited by examiner

LUTETIUM NITRIDE-BASED PHOSPHOR AND LIGHT EMITTING DEVICE COMPRISING SAME

The present application is a U.S. National Phase application based upon PCT Application No. PCT/CN2017/091241 filed on Jun. 30, 2017 which claims the benefit of priority to Chinese patent application No. 201610514087.3, titled "Lutetium Nitride-Based Phosphor and Light Emitting Device Comprising Same", filed with the Chinese State Intellectual Property Office on Jun. 30, 2016, the entire disclosures of which are incorporated herein by reference.

FIELD OF THE INVENTION

The present invention relates to the technical field of fluorescent materials, and particularly, to a lutetium nitride-based phosphor and a light emitting device comprising the same.

BACKGROUND ART

White LED being a novel green solid light source, compared with the conventional incandescent lamp, the fluorescent light source has the advantages of highly effective light emission, low power consumption, long use life, few heat emission, small volume, resistance to damage, quick response, and environment-friendliness, and has found successful applications in the fields of semiconductor lighting and liquid crystal backlight display.

Currently, the mainstream embodiment scheme of white LED is to allocate the blue LED chip with a phosphor with various emission wavelengths, the phosphor being the critical factor that decides the light emission efficiency of the white LED device, particularly such performances as the chromatic temperature and the color rendering index. Yellow phosphor and yellow-green phosphor of the aluminate series are currently the most mature phosphor systems, occupying more than 70% market capacity.

High-power white LED, laser lighting and display are the important development tendency in the future, so higher demand is put on the stability of the phosphors matched therewith, but the thermal stability of the aluminate-series phosphors are no longer able to meet the requirements of high-density energy excitation. For example, the Japanese Mitsubishi Chemical Corporation has invented a novel nitride phosphor, whose stability is better than that of the aluminate-series phosphors see for details patent documents with publication numbers CN101663372A and CN102361956A; the silicon-based nitride phosphor reported by XIE Rongjun et al. has relatively low light emission efficiency see for details non-patent document *J. Am. Ceram. Soc.* 96[6] 1688-1690 (2013).

However, the emission spectrum of the nitride phosphor provided by the aforementioned patent documents is difficultly adjustable, so it is hard to flexibly adjust its photochromic property according to needs, and this in turn restricts its application. The fluorescent substance provided by the non-patent document has weak emission efficiency, and this also restricts its application in such fields as high-power white LEDs.

SUMMARY OF THE INVENTION

The main objective of the present invention is to provide a lutetium nitride-based phosphor and a light emitting device comprising the same, so as to address the prior-art problems of difficult adjustability of emission spectrum and low light emission efficiency of phosphors.

In order to achieve the above objective, according to one aspect of the present invention, there is provided a lutetium nitride-based phosphor comprising an inorganic compound; the composition of the inorganic compound comprises at least an M element, an A element, a D element and an R element, of which the M element is one or two elements selected from a group consisting of Lu, La, Pr, Nd, Sm, Y, Tb and Gd, and necessarily comprises Lu; the A element is Si and/or Ge; the D element is one or two elements selected from a group consisting of O, N and F, and necessarily comprises N; the R element is Ce and/or Dy, and the atomic molar ratio of the Lu element in the M element is greater than 50%.

Further, the inorganic compound has a crystal structure the same as $Y_3Si_6N_{11}$.

Further, the inorganic compound has a composition of $M_{3-a}A_xD_y:aR$, in which parameters a, x and y satisfy the following conditions: $0<a\leq0.8$, $5\leq x\leq7$, $10\leq y\leq12$.

Further, the atomic molar ratio of the Lu element in the M element is $\geq 70\%$, preferably $\geq 80\%$.

Further, the element A is Si.
Further, the element D is N.
Further, the element R is Ce.
Further, $0.1\leq a\leq 0.5$; $5.5\leq x\leq 6.5$, preferably $x=6$; $10.5\leq y\leq 11.5$, preferably $y=11$.

Further, the lutetium nitride-based phosphor has a peak wavelength of excitation spectrum at 400 to 460 nm, and can emit a peak wavelength covering the range between 475 to 540 nm.

According to another aspect of the present invention, there is provided a light emitting device comprising a fluorescent substance and an excitation light source, of which the fluorescent substance comprises the aforementioned lutetium nitride-based phosphor.

Further, the excitation light source is a semiconductor light emitting diode or a laser light source, preferably, the excitation light source has an emission peak wavelength of 400 to 490 nm.

Further, the fluorescent substance further comprises another/other phosphor(s) selected from the group consisting of anyone or more of $(Y,Gd,Lu,Tb)_3(Al,Ga)_5O_{12}:Ce^{3+}$, $\beta$-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$. According to the technical solutions of the present invention, since the ion radius of $Lu^{3+}$ is smaller than that of $La^{3+}$, when the inorganic compound forming the phosphor comprises element Lu, the original ligand site would be contracted; in order to reduce lattice distortion due to the ligand site contraction, the adjacent ligand site expands, and this weakens the existing crystal field environment, so that the emission spectrum of the lutetium nitride-based phosphor having the inorganic compound can be easily adjusted even adjusted to the green light region, and therefore its photochromic property can be flexibly adjusted according to needs; at the same time, since the content of the Lu element is greater than 50%, the main component of the inorganic compound is changed, that is to say, the originally substituted element is changed to the Lu element, and such change ameliorates lattice distortion and forms single crystal grains of relatively uniform formations the single crystal grains have long-range order, i.e., the inorganic compound achieves better crystallization properties; furthermore, its thermal stability is relatively good to the extent that the need for high-density energy excitation can be satisfied.

EXPLANATIONS OF THE ACCOMPANYING DRAWINGS

The drawings accompanying the Description that constitutes a part of the present application is used to provide further comprehension of the present invention. The exemplary examples of the present invention and the explanations thereof are meant to explain the present invention, but should not be so construed as to restrict the present invention. In the drawings.

SPECIFIC EXAMPLES

Figure 1:
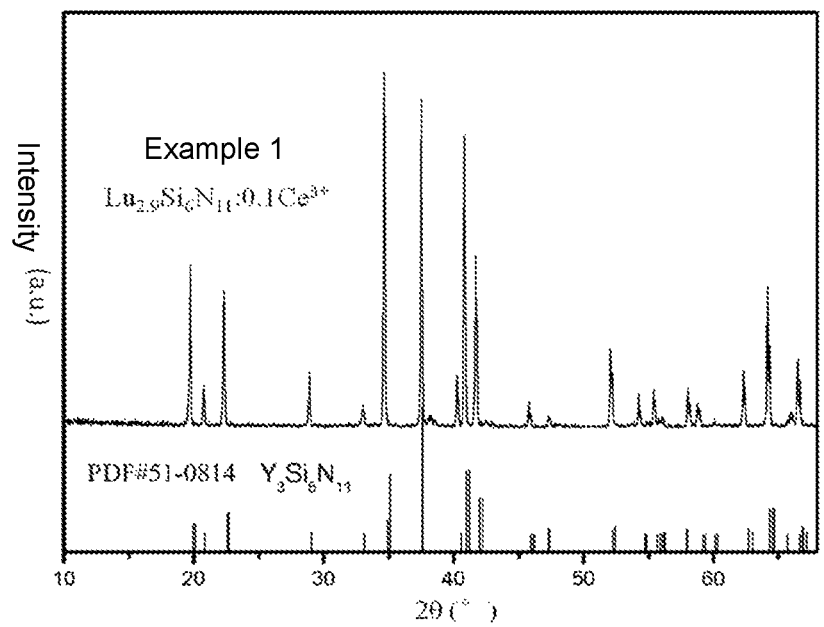
FIG. 1 illustrates XRD diffraction patterns of the lutetium nitride-based phosphor according to Example 1 of the present invention.

As should be noted, under the circumstance of not being conflictive, examples and features in the Examples of the present application can be mutually combined. The present invention will be described in detail below in conjunction with the Examples.

As has been noted in the Background Art, although currently available nitride phosphor is rather good in terms of thermal stability, its emission spectrum is difficultly adjustable, so it is hard to flexibly adjust its photochromic property according to needs, and this in turn restricts its application. In order to address the above problem, the present application provides a phosphor, and a light emitting device having the phosphor.

In a typical example of the present application there is provided a lutetium nitride-based phosphor comprising an inorganic compound; the composition of the inorganic compound comprises at least an M element, an A element, a D element and an R element, of which the M element is one or two elements selected from a group consisting of Lu, La, Pr, Nd, Sm, Y, Tb and Gd, and necessarily comprises Lu; the A element is Si and/or Ge; the D element is one or two elements selected from a group consisting of O, N and F, and necessarily comprises N; the R element is Ce and/or Dy, and the atomic molar ratio of the Lu element in the M element is greater than 50%.

The inorganic compound is used as a constituent part of the phosphor or used as the phosphor per se, so based on comprising the above elements its composition has the crystal structure suitable for forming a phosphor, or it can be understood thus that the aforementioned elements are utilized to substitute corresponding elements of the inorganic compound forming the existing phosphor—for instance, the M element is used to substitute a corresponding lanthanide element. The following theoretic explanation is made all on the basis of having the crystal structure of a phosphor. Since the ion radius of $Lu^{3+}$ is smaller than that of $La^{3+}$, when the inorganic compound forming the phosphor comprises the Lu element, the original ligand site would be contracted; in order to reduce lattice distortion due to the ligand site contraction, the adjacent ligand site expands, and this weakens the existing crystal field environment, so that the emission spectrum of the lutetium nitride-based phosphor having the inorganic compound can be easily adjusted,—even adjusted to the green light region, and therefore its photochromic property can be flexibly adjusted according to needs; at the same time, since the content of the Lu element is greater than 50%, the main component of the inorganic compound is changed, that is to say, the originally substituted element is changed to the Lu element, and such change ameliorates lattice distortion and forms single crystal grains of relatively uniform formations the single crystal grains have long-range order, i.e., the inorganic compound achieves better crystallization properties; furthermore, its thermal stability is relatively good to the extent that the need for high-density energy excitation can be satisfied.

Out of the above theoretical consideration, preferably, the inorganic compound has a crystal structure the same as $Y_3Si_6N_{11}$. The inorganic compound according to the present application differs in structure from the existing $La_3Si_6N_{11}:Ce^{3+}$, but it retains the generality of excellent thermal stability with commercially available $La_3Si_6N_{11}:Ce^{3+}$ phosphor, and the emission efficiency of the claimed inorganic compound has more room for improvement than $La_3Si_6N_{11}:Ce^{3+}$— for instance, the emission spectrum of this inorganic compound is more flexibly adjustable.

In a preferred example of the present application, the inorganic compound preferably has a composition of $M_{3-a}A_xD_y:aR$, wherein parameters a, x and y satisfy the following conditions: $0<a\le0.8$, $5\le x\le7$, $10\le y\le12$.

In the above composition, big quantities of Lu substitute the La element, and after Lu has substituted La to a certain degree, the crystal structure is changed into $Y_3Si_6N_{11}$, with the adjustable range of the emission spectrum more broader the emission spectrum can be adjusted from 475 nm to 540 nm; moreover, compared with $Y_3Si_6N_{11}:Ce^{3+}$, the emission strength and thermal stability of the lutetium nitride-based phosphor according to the present application are apparently enhanced, while thermal stability is basically consistent with that of $La_3Si_6N_{11}:Ce^{3+}$, so based on retaining the excellent thermal stability of $La_3Si_6N_{11}:Ce^{3+}$, the present application enables the preparation of a lutetium nitride-based phosphor that is higher in emission efficiency than $Y_3Si_6N_{11}:Ce^{3+}$, and more flexible in spectrum adjustability than $La_3Si_6N_{11}:Ce^{3+}$.

Lu is the main medium material of the inorganic compound in the present application, and there is a certain atomic number proportional relationship between the activator and the M element in the medium material in order to guarantee that the phosphor obtained after doping of the activator has higher emission efficiency, it is preferable that the atomic molar ratio of the Lu element in the M element is 70%, preferably 80%.

In another preferred example of the present application, the A element is Si. It is further preferred that the D element is N. It is more preferred that the R element is Ce. Since the difference between ion radii $Lu^{3+}$ (0.848 Å) and $Ce^{3+}$ (1.03 Å) is greater than the difference between ion radii $La^{3+}$ (1.06 Å) and $Ce^{3+}$ (1.03 Å), after the aforementioned inorganic compound has been doped with small amount of $Ce^{3+}$, lattice distortion is partially strengthened due to the relatively great difference between Ce and Lu ion radii, thereby leading to increase in the crystal field strength, and, at the same time, there are two types of Lu lattice sites with relatively great difference in partial ligand site environments in the inorganic compound. On the basis of the above two points, 5d energy level splitting of $Ce^{3+}$ is enhanced, whereby the adjustability flexibility of the emission spectrum of the inorganic compound is further enhanced.

As has been found after test and research, when the content of the R element is too few, since the luminescence center is few, the brightness would be low; when the content of the R element is too high, concentration quenching would occur thereby leading to enhancement of non-radiative transition, so brightness would also be low, so $0.1 \leq a \leq 0.5$ is preferred; in order to obtain a white LED device having pure phase, excellent crystallization property, consistence in single crystal grains and forms, high emission efficiency and high color rendering index, the range is preferably $5.5 \leq x \leq 6.5$, more preferably $x=6$; $10.5 \leq y \leq 11.5$, more preferably $y=11$.

The lutetium nitride-based phosphor with thus composed inorganic compound has a peak wavelength of excitation spectrum at 400 to 460 nm—a range broader than the emission spectrum of existing nitride phosphors, and more easily adjustable—and emits a peak wavelength covering the range between 475 to 540 nm, that is to say, it can emit blue-bluish green-green-bluish green lights.

The aforementioned phosphor of the present application can be prepared by the method in the patent document recited in the Background Art section, and preferably prepared by the following steps:

step 1) proportioning materials according to chemical formula $M_{3-a}A_xD_y$:aR, selecting a simple substance, a nitride, an oxide selected from an element M, an element A, an element D and an element R or an alloy thereof, and taking and uniformly mixing the source materials according to molar ratios required by the above chemical formula to obtain a mixture;

step 2) placing the mixture obtained by step 1) into a container and calcinating the same in nitrogen or other non-oxidizing conditions to obtain a calcinated product, wherein the highest sintering temperature is from 1500 to 2000° C., and the holding time is 5 to 20 hours; and step 3)—sequentially subjecting the calcinated product in step 2) to crushing, washing, sieving and baking processes to obtain the phosphor.

In another typical example of the present application, there is provided a light emitting device comprising a fluorescent substance and an excitation light source, of which the fluorescent substance comprises the aforementioned lutetium nitride-based phosphor. Since the lutetium nitride-based phosphor according to the present application has high thermal stability and easy adjustability of emission spectrum, the light emitting device having the phosphor has high operating stability and longer use life, and is applicable to many different requirements.

In a preferred example of the present application, the excitation light source is a semiconductor light emitting diode or a laser light source, preferably, the excitation light source has an emission peak wavelength of 400 to 490 nm. Excitation bands of currently commercially available LED excitation light sources lie within the range, specifically, there are two types of excitation light sources: near ultraviolet diode with the wavelength range between 380 to 420 nm, and blue diode with the wavelength range between 420 to 490 nm. Moreover, the excitation peak wavelength of the aforementioned phosphor is about 440 nm, so the use of a light emitting diode within the above wavelength range facilitates photoluminescence of the phosphor.

In order to further improve the emission effect of the light emitting device, it is preferred that the fluorescent substance further comprises other phosphors selected from the group consisting of anyone or more of $(Y,Gd,Lu,Tb)_3(Al,Ga)_5O_{12}$:$Ce^{3+}$, β-SiAlON:$Eu^{2+}$, $(Ca,Sr)AlSiN_3$:$Eu^{2+}$, $(Li,Na,K)_2(Ti,Zr,Si,Ge)F_6$:$Mn^{4+}$ and $(Ca,Sr,Ba)MgAl_{10}O_{17}$:$Eu^{2+}$. The sign "," in between the various elements indicates that any element or elements within the parenthesis may be a single component or a solid solution comprising two or more elements for instance, $(Ca,Sr)AlSiN_3$:$Eu^{2+}$ stands for one or more solid solutions in $CaAlSiN_3$:$Eu^{2+}$, $SrAlSiN_3$:$Eu^{2+}$ and $Ca_{1-x}Sr_xAlSiN_3$:$Eu^{2+}$ (0<x<1). Use of the phosphor according to the present application in cooperation with the aforementioned phosphors enables light emitting devices to emit white light with high emission efficiency, high color rendering index and low chromatic temperature, these white-light light emitting devices being applicable to the field of illumination or display.

Advantageous effects of the present application are explained in further detail below in conjunction with Examples and Comparative Examples.

Example 1

Basing on the stoichiometric proportion of $Lu_{2.9}Si_6N_{11}$:$0.1Ce^{3+}$, source materials of LuN (99.9%), $Si_3N_4$ (99.9%) and $CeO_2$ (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{2.9}Si_6N_{11}$:$0.1Ce^{3+}$ phosphor of Example 1. The phosphor is subjected to X-ray scanning to arrive at FIG. 1, in which the Bragg angles scanned are 10 to 68°, and the scanning rate is 6°/min; the phosphor is subjected to fluorescence spectrum test, with excitation monitor wavelength as 490 nm, and emission monitor wavelength as 440 nm see FIG. 2 for the monitor result.

Figure 2:
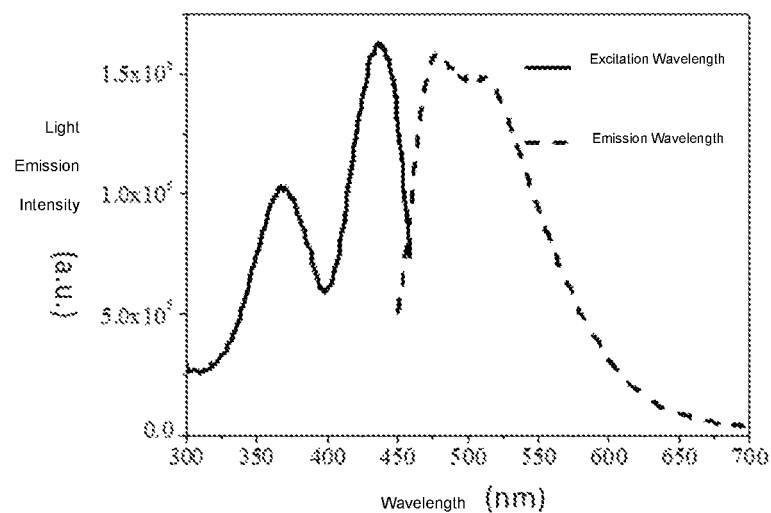
FIG. 2 illustrates excitation spectrum and emission spectrum of the lutetium nitride-based phosphor according to Example 1 of the present invention.

As can be seen from the result of FIG. 1, $Lu_{2.9}Si_6N_{11}$:$0.1Ce^{3+}$ of the present application as the same crystal structure as $Y_3Si_6N_{11}$.

Example 2

The $Lu_{2.9}Si_6N_{11}$:$0.1Ce^{3+}$ obtained in Example 1, a white LED yellow fluorescent material $Y_3Al_5O_{12}$:$Ce^{+3}$, and a red fluorescent material $CaAlSiN_3$:$Eu^{2+}$ are mixed at a mass ratio of 15:70:15 and put in silica gel to form a sticky substance; the sticky substance is coated on a 430 nm blue LED chip to obtain a white-light LED device; the white-light LED device is tested, by a remote SIS-3_1.0m steel photometric integrating sphere R98, with drive current of 60 mA, to show the test results of a color rendering index as 86, a color coordinate as (0.32,0.36), and an emission efficiency as 140 1 m/W.

Comparative Example 1

Basing on the stoichiometric proportion $La_{2.86}Si_6N_{11}$:$0.14Ce^{3+}$, source materials of 43.76 g LaN (99.9%), 28.56 g $Si_3N_4$ (99.9%) and 2.156 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $La_{2.86}Si_6N_{11}$:$0.14Ce^{3+}$ phosphor of Comparative Example 1.

Comparative Example 2

Basing on the stoichiometric proportion $Y_{2.9}Si_6N_{11}$:$0.1Ce^{3+}$, source materials of 29.87 g LaN (99.9%), 28.56 g Si$_3$N$_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product.

The calcinated product is taken out to be crushed, washed, sieved and baked to obtain Y$_{2.9}$Si$_6$N$_{11}$:0.1Ce$^{3+}$ phosphor of Comparative Example 2.

Example 3

Basing on the stoichiometric proportion of Lu$_{2.1}$Si$_6$N$_{11}$:0.9Ce$^{3+}$, source materials of 39.69 g LuN (99.9%), 28.56 g Si$_3$N$_4$ (99.9%) and 13.86 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain Lu$_{2.1}$Si$_6$N$_{11}$:0.9Ce$^{3+}$ phosphor of Example 3.

Example 4

Basing on the stoichiometric proportion of Lu$_{2.2}$Si$_6$N$_{11}$:0.8Ce$^{3+}$, source materials of 41.58 g LuN (99.9%), 28.56 g Si$_3$N$_4$ (99.9%) and 12.32 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain Lu$_{2.2}$Si$_6$N$_{11}$:0.8Ce$^{3+}$ phosphor of Example 4.

Example 5

Basing on the stoichiometric proportion of Lu$_{2.2}$Si$_6$N$_{11}$:0.7Ce$^{3+}$, 0.1Dy$^{3+}$, source materials of 39.69 g LuN (99.9%), 28.56 g Si$_3$N$_4$ (99.9%), 10.78 g CeN (99.99%) and 2.19 g DyF$_3$ (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain Lu$_{2.2}$Si$_6$N$_{11}$:0.7Ce$^{3+}$, 0.1Dy$^{3+}$ phosphor of Example 5.

Example 6

Basing on the stoichiometric proportion of La$_{1.16}$Lu$_{1.74}$Si$_6$N$_{11}$:0.1Ce$^{3+}$, source materials of 17.88 g LaN (99.9%), 32.89 g LuN (99.9%), 28.56 g Si$_3$N$_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain La$_{1.16}$Lu$_{1.74}$Si$_6$N$_{11}$:0.1 Ce$^{3+}$ phosphor of Example 6.

Example 7

Basing on the stoichiometric proportion of La$_{0.7375}$Lu$_{2.2125}$Si$_6$N$_{11}$:0.05Ce$^{3+}$, source materials of 11.28 g LaN (99.9%), 41.82 g LuN (99.9%), 28.56 g Si$_3$Na (99.9%) and 0.77 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain La$_{0.7375}$Lu$_{2.2125}$Si$_6$N$_{11}$:0.05Ce$^{3+}$ phosphor of Example 7.

Example 8

Basing on the stoichiometric proportion of La$_{0.575}$Lu$_{2.325}$Si$_6$N$_{11}$:0.1Ce$^{3+}$, source materials of 8.8 g LaN (99.9%), 43.85 g LuN (99.9%), 28.56 g Si$_3$N$_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain La$_{0.575}$Lu$_{2.325}$Si$_6$N$_{11}$:0.1Ce$^{3+}$ phosphor of Example 8.

Example 9

Basing on the stoichiometric proportion of Lu$_3$Si$_5$N$_{10}$:0.3Ce$^{3+}$, source materials of 56.7 g LuN (99.9%), 23.38 g Si$_3$N$_4$ (99.9%) and 4.63 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain Lu$_3$Si$_5$N$_{10}$:0.3Ce$^{3+}$ phosphor of Example 9.

Example 10

Basing on the stoichiometric proportion of Lu$_{2.57}$Si$_7$N$_{12}$:0.1Ce$^{3+}$, source materials of 48.57 g LuN (99.9%), 32.7 g Si$_3$N$_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{2.57}Si_7N_{12}$:$0.1Ce^{3+}$ phosphor of Example 10.

Example 11

Basing on the stoichiometric proportion of $Lu_{3.07}Si_{5.5}N_{10.5}$:$0.1Ce^{3+}$, source materials of 58.023 g LuN (99.9%), 23.67 g $Si_3N_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{3.07}Si_{5.5}N_{10.5}$:$0.1Ce^{3+}$ phosphor of Example 11.

Example 12

Basing on the stoichiometric proportion of $Lu_{2.73}Si_{6.5}N_{11.5}$:$0.1Ce^{3+}$, source materials of 51.6 g LuN (99.9%), 30.33 g $Si_3N_4$ (99.9%) and 1.54 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{2.73}Si_{6.5}N_{11.5}$:$0.1Ce^{3+}$ phosphor of Example 12.

Example 13

Basing on the stoichiometric proportion of $Lu_{25}Si_6N_{11}$:$0.5Ce^{3+}$, source materials of 47.25 g LuN (99.9%), 28.56 g $Si_3N_4$ (99.9%) and 7.7 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{25}Si_6N_{11}$:$0.5Ce^{3+}$ phosphor of Example 13.

Example 14

Basing on the stoichiometric proportion of $Lu_{2.86}Si_6N_{11}$:$0.14Ce^{3+}$, source materials of 54.05 g LuN (99.9%), 28.56 g $Si_3N_4$ (99.9%) and 2.156 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{286}Si_6N_{11}$:$0.14Ce^{3+}$ phosphor of Example 14.

Example 15

Basing on the stoichiometric proportion of $Lu_{2.8}Si_6N_{11}$:$0.2Ce^{3+}$, source materials of 52.92 g LuN (99.9%), 28.56 g $Si_3N_4$ (99.9%) and 3.08 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{2.8}Si_6N_{11}$:$0.2Ce^{3+}$ phosphor of Example 15.

Example 16

Basing on the stoichiometric proportion of $Lu_{27}Si_6N_{11}$:$0.3Ce^{3+}$, source materials of 51.03 g LuN (99.9%), 28.56 g $Si_3N_4$ (99.9%) and 4.62 g CeN (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{27}Si_6N_{11}$:$0.3Ce^{3+}$ phosphor of Example 16.

Example 17

Basing on the stoichiometric proportion of $Lu_{2.86}Si_{5.9}N_{10.5}O_{0.5}$:$0.14Ce^{3+}$, source materials of 54.05 g LuN (99.9%), 26.4 g $Si_3N_4$ (99.9%), 2.156 g CeN (99.99%) and $1.5SiO_2$ (99.99%) are precisely weighted, and mixed to form a mixed source material. The mixed source material is fully mixed and ground in a glove compartment for 30 minutes to obtain a mixture. The mixture is heated at a heating rate of 10° C./min to 1850° C. under pure nitrogen environment, then held at 1850° C. for 10 hours, and subsequently naturally cooled to obtain a calcinated product. The calcinated product is taken out to be crushed, washed, sieved and baked to obtain $Lu_{2.86}Si_{5.9}N_{10.5}O_{0.5}$:$0.14Ce^{3+}$ phosphor of Example 17.

Test results of emission peak wavelengths, external quantum efficiencies and packaging color rendering indices of the phosphors in the above Examples are shown in the following Table 1, in which quantum efficiencies are tested by a QE-2100 quantum efficiency meter, with $BaSO_4$ being selected as guide sample for comparison, and coloring indices are tested by HAAS2000.

TABLE 1

Proportional Compositions of Various Elements in Comparative Examples and Examples

| | M | R | D | a | x | y | EPW nm | EQE % |
|---|---|---|---|---|---|---|---|---|
| C. Example 1 | La | Ce | N | 0.14 | 6 | 11 | 535 | 98.7 |
| C. Example 2 | Y | Ce | N | 0.1 | 6 | 11 | 550 | 58.2 |
| Example 3 | Lu | Ce | N | 0.9 | 6 | 11 | 540 | 65.1 |
| Example 4 | Lu | Ce | N | 0.8 | 6 | 11 | 536 | 68.5 |
| Example 5 | Lu | Ce + Dy | N | 0.8 | 6 | 11 | 535 | 67.3 |
| Example 6 | La + Lu | Ce | N | 0.1 | 6 | 11 | 530 | 78.1 |

TABLE 1-continued

Proportional Compositions of Various Elements in Comparative Examples and Examples

| | M | R | D | a | x | y | EPW nm | EQE % |
|---|---|---|---|---|---|---|---|---|
| Example 7 | La + Lu | Ce | N | 0.05 | 6 | 11 | 524 | 77.6 |
| Example 8 | La + Lu | Ce | N | 0.1 | 6 | 11 | 518 | 83.8 |
| Example 9 | Lu | Ce | N | 0.3 | 5 | 10 | 488 | 77.2 |
| Example 10 | Lu | Ce | N | 0.1 | 7 | 12 | 479 | 76.8 |
| Example 11 | Lu | Ce | N | 0.1 | 5.5 | 10.5 | 480 | 73.8 |
| Example 12 | Lu | Ce | N | 0.1 | 6.5 | 11.5 | 482 | 74.3 |
| Example 13 | Lu | Ce | N | 0.5 | 6 | 11 | 510 | 78.5 |
| Example 14 | Lu | Ce | N | 0.14 | 6 | 11 | 485 | 80.3 |
| Example 15 | Lu | Ce | N | 0.2 | 6 | 11 | 490 | 78.2 |
| Example 16 | Lu | Ce | N | 0.3 | 6 | 11 | 496 | 78.6 |
| Example 17 | Lu | Ce | N + O | 0.14 | 5.9 | 11 | 483 | 76.2 |

(EPW stands for Emission Peak Wavelength; EQE stands for External Quantum Efficiency)

As should be pointed out here, a, x, y respectively stand for stoichiometric ratios corresponding to different elements in the specific molecular formulae of the samples in the various Examples.

As can be seen from the data in the above Table 1, the emission peak wavelengths of the phosphors having the composition according to the present application in Examples 3 to 17 all lie within the wavelength range of 460 to 540 nm; moreover, as can be seen from the comparison between Examples 3 and 4, with the increase in the content of the Lu element, blue shift occurs in the emission wavelength; as can be seen from the comparison between Examples 4 and 5, when Ce and Dy are simultaneously used, emission peak wavelengths and external quantum efficiencies are not apparently changed, but $Dy^{3+}$ has stronger emission at the yellow region the addition of suitable amount of $Dy^{3+}$ helps improve the photochromic property of phosphors; as can be seen from the comparison between Examples 6 and 8, when Lu and La are simultaneously used, the change in the content of Lu obviously affects the emission wavelength with the increase in its content, blue shift occurs in the emission wavelength.

Moreover, the X-ray scanning results of the phosphors specified in the above Examples 3 through 17 all show the same diffraction peak peaking positions and similar strengths as those in FIG. 1, that is to say, it can be judged that they have the same crystal structure as $Y_3Si_6N_{11}$.

Figure 3:
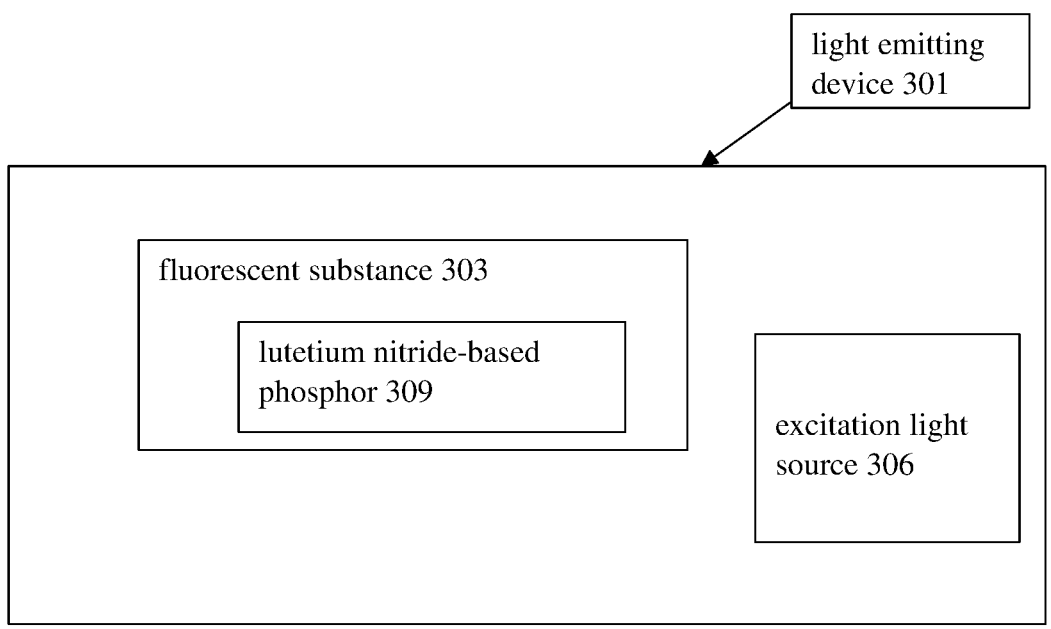
FIG. 3 is a diagram of a light emitting device of the present application.

Referring to FIG. 3, a light emitting device 301 includes a fluorescent substance 303 and an excitation light source 306, and that the fluorescent substance 303 have the lutetium nitride-based phosphor 309.

As can be seen from the above description, the aforementioned Examples of the present invention achieve the following technical effects: since the ion radius of $Lu^{3+}$ is smaller than that of $La^{3+}$, when the inorganic compound forming the phosphor comprises element Lu, the original ligand site would be contracted; in order to reduce lattice distortion due to the ligand site contraction, the adjacent ligand site expands, and this weakens the existing crystal field environment, so that the emission spectrum of the lutetium nitride-based phosphor having the inorganic compound can be easily adjusted—even adjusted to the green light region, and therefore its photochromic property can be flexibly adjusted according to needs; at the same time, since the content of the Lu element is greater than 50%, the main component of the inorganic compound is changed, that is to say, the originally substituted element is changed to the Lu element, and such change ameliorates lattice distortion and forms single crystal grains of relatively uniform formations the single crystal grains have long-range order, i.e., the inorganic compound achieves better crystallization properties; furthermore, its thermal stability is relatively good to the extent that the need for high-density energy excitation can be satisfied.

Since the difference between ion radii $Lu^{3+}$ (0.848 Å) and $Ce^{3+}$ (1.03 Å) is greater than the difference between ion radii $La^{3+}$ (1.06 Å) and $Ce^{3+}$ (1.03 Å), after the aforementioned inorganic compound has been doped with small amount of $Ce^{3+}$, lattice distortion is partially strengthened due to the relatively great difference between Ce and Lu ion radii, thereby leading to increase in the crystal field strength, and, at the same time, there are two types of Lu lattice sites with relatively great difference in partial ligand site environments in the inorganic compound. On the basis of the above two points, 5d energy level splitting of $Ce^{3+}$ is enhanced, whereby the adjustability flexibility of the emission spectrum of the inorganic compound is further enhanced.

What the above recited are merely preferred examples of the present invention, and they are not meant to restrict the present invention, as persons skilled in the art may make various modifications and variations to the present invention. Any amendment, equivalent substitution or improvement made within the spirit and principle of the present invention shall all be covered within the protection scope of the present invention.

What is claimed is:

1. A lutetium nitride-based phosphor, comprising an inorganic compound, wherein the composition of the inorganic compound comprises at least an M element, an A element, a D element and an R element, wherein the M element is one or two elements selected from a group consisting of Lu, La, Pr, Nd, Sm, Y, Tb and Gd, and necessarily comprises Lu; the A element is Si and/or Ge; the D element is one or two elements selected from a group consisting of O, N and F, and necessarily comprises N; the R element is Ce and/or Dy, and the atomic molar ratio of the Lu element in the M element is greater than 50%, wherein
  the inorganic compound has a crystal structure the same as $Y_3Si_6N_{11}$;
  the inorganic compound has a composition of $M_{3-a}A_xD_y$:aR, wherein parameters a, x and y satisfy the following conditions: $0<a\leq0.8$, $5\leq x\leq7$, $10\leq y\leq12$.

2. The lutetium nitride-based phosphor according to claim 1, wherein the atomic molar ratio of the Lu element in the M element is $\geq70\%$, preferably $\geq80\%$.

3. The lutetium nitride-based phosphor according to claim 1, wherein the A element is Si.

4. The lutetium nitride-based phosphor according to claim 1, wherein the D element is N.

5. The lutetium nitride-based phosphor according to claim 1, wherein the R element is Ce.

6. The lutetium nitride-based phosphor according to claim 5, wherein $0.1\leq a\leq0.5$; $5.5\leq x\leq6.5$, preferably $x=6$; $10.5\leq y\leq11.5$, preferably $y=11$.

7. The lutetium nitride-based phosphor according to claim 1, wherein the lutetium nitride-based phosphor has a peak wavelength of excitation spectrum at 400 to 460 nm, and can emit a peak wavelength covering the range between 475 to 540 nm.

8. A light emitting device, comprising a fluorescent substance and an excitation light source, wherein the fluorescent substance comprises the lutetium nitride-based phosphor according to claim 1.

9. The light emitting device according to claim 8, wherein the excitation light source is a semiconductor light emitting diode or a laser light source, preferably, the excitation light source has an emission peak wavelength of 400 to 490 nm.

10. The light emitting device according to claim 8, wherein the fluorescent substance further comprises another/other phosphor(s) selected from a group consisting of anyone or more of $(Y,Gd,Lu,Tb)_3(Al,Ga)_5O_{12}:Ce^{3+}$,β-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$.

11. The lutetium nitride-based phosphor according to claim 1, wherein the A element is Si, the D element is N, and the R element is Ce.

12. The lutetium nitride-based phosphor according to claim 1, wherein the A element is Si, the D element is N, and the R element is Ce, and $0.1 \leq a \leq 0.5$; $5.5 \leq x \leq 6.5$, preferably x=6; $10.5 \leq y \leq 11.5$, preferably y=11.

13. The lutetium nitride-based phosphor according to claim 1, wherein the A element is Si, the D element is N, and the R element is Ce, $0.1 \leq a \leq 0.5$; $5.5 \leq x \leq 6.5$, preferably x=6; $10.5 \leq y \leq 111.5$, preferably y=11;

the lutetium nitride-based phosphor has a peak wavelength of excitation spectrum at 400 to 460 nm, and can emit a peak wavelength covering the range between 475 to 540 nm.

14. The light emitting device according to claim 8, wherein the excitation light source is a semiconductor light emitting diode or a laser light source, preferably, the excitation light source has an emission peak wavelength of 400 to 490 nm; and the fluorescent substance further comprises another/other phosphor(s) selected from a group consisting of anyone or more of $(Y,Gd,Lu,Tb)_3(Al,Ga)_5O_{12}:Ce^{3+}$,β-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$.

15. The light emitting device according to claim 8, wherein the excitation light source is a semiconductor light emitting diode or a laser light source, preferably, the excitation light source has an emission peak wavelength of 400 to 490 nm;

the fluorescent substance further comprises another/other phosphor(s) selected from a group consisting of anyone or more of $(Y,Gd,Lu,Tb)_3(Al,Ga)_5O_{12}:Ce^{3+}$,β-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$; and the A element is Si, the D element is N, and the R element is Ce.

16. The light emitting device according to claim 8, wherein the excitation light source is a semiconductor light emitting diode or a laser light source, preferably, the excitation light source has an emission peak wavelength of 400 to 490 nm;

the fluorescent substance further comprises another/other phosphor(s) selected from a group consisting of anyone or more of $(Y,Gd,Lu,Tb)_3(Al,Ga)_5O_{12}:Ce^{3+}$,β-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$;

the A element is Si, the D element is N, and the R element is Ce; and $0.1 \leq a \leq 0.5$; $5.5 \leq x \leq 6.5$, preferably x=6; $10.5 \leq y \leq 11.5$, preferably y=11.

17. The light emitting device according to claim 8, wherein the excitation light source is a semiconductor light emitting diode or a laser light source, preferably, the excitation light source has an emission peak wavelength of 400 to 490 nm;

the fluorescent substance further comprises another/other phosphor(s) selected from a group consisting of anyone or more of $(Y,Gd,Lu,Tb)_3(Al,Ga)_5O_{12}:Ce^{3+}$, β-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$;

the A element is Si, the D element is N, and the R element is Ce;

$0.1 \leq a \leq 0.5$; $5.5 \leq x \leq 6.5$, preferably x=6; $10.5 \leq y \leq 11.5$, preferably y=11; and the lutetium nitride-based phosphor has a peak wavelength of excitation spectrum at 400 to 460 nm, and can emit a peak wavelength covering the range between 475 to 540 nm.

* * * * *